US010813259B2

(12) United States Patent
Iwaki

(10) Patent No.: US 10,813,259 B2
(45) Date of Patent: Oct. 20, 2020

(54) BOARD WORK MACHINE AND INSERTION METHOD

(71) Applicant: FUJI CORPORATION, Chiryu (JP)

(72) Inventor: Noriaki Iwaki, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 245 days.

(21) Appl. No.: 15/776,134

(22) PCT Filed: Nov. 18, 2015

(86) PCT No.: PCT/JP2015/082402
§ 371 (c)(1),
(2) Date: May 15, 2018

(87) PCT Pub. No.: WO2017/085810
PCT Pub. Date: May 26, 2017

(65) Prior Publication Data
US 2018/0324988 A1   Nov. 8, 2018

(51) Int. Cl.
*H05K 3/30* (2006.01)
*H05K 13/04* (2006.01)

(52) U.S. Cl.
CPC ........... *H05K 13/046* (2013.01); *H05K 13/04* (2013.01); *H05K 13/0404* (2013.01); *H05K 13/0406* (2018.08)

(58) Field of Classification Search
CPC ............... H05K 13/04; H05K 13/0404; H05K 13/0406; H05K 13/046
See application file for complete search history.

(56) References Cited

U.S. PATENT DOCUMENTS

| 5,205,032 A | 4/1993 | Kuroda et al. |
| 9,992,918 B2 * | 6/2018 | Watanabe .......... H05K 13/0408 |
| 2015/0128410 A1 | 5/2015 | Watanabe et al. |
| 2018/0184553 A1 * | 6/2018 | Degura .............. G06K 7/10722 |
| 2018/0295759 A1 * | 10/2018 | Degura ................. G06T 7/0006 |
| 2019/0269051 A1 * | 8/2019 | Tanaka ............... H05K 13/0413 |

FOREIGN PATENT DOCUMENTS

| JP | 4-107997 A | 4/1992 |
| JP | 5-114800 A | 5/1993 |
| JP | 9-36596 A | 2/1997 |
| JP | 2013-222771 A | 10/2013 |
| JP | 2015-95574 A | 5/2015 |

OTHER PUBLICATIONS

International Search Report dated Feb. 16, 2016 in PCT/JP2015/082402, filed Nov. 18, 2015.

* cited by examiner

Primary Examiner — Paul D Kim
(74) Attorney, Agent, or Firm — Oblon, McClelland, Maier & Neustadt, L.L.P.

(57) ABSTRACT

A component mounter provided with a component holding tool that holds leaded component, and a moving device that moves the component holding tool to a given position, wherein leads of leaded component held by the component holding tool are contacted against the upper surface of circuit board, are moved in a state being elastically deformed, and are inserted into through-hole of circuit board. Thus, even in a case in which leads are contacted against the upper surface of circuit board without leads being directly inserted into through-holes, it is possible to insert leads into through-holes. Also, it is possible to prevent plastic deformation of leads by leads being pressed too much in a state contacting the upper surface of circuit board.

3 Claims, 17 Drawing Sheets

BOARD WORK MACHINE AND INSERTION METHOD

TECHNICAL FIELD

The present application relates to a board work machine that mounts leaded components on a board, and to an insertion method for inserting a lead of a leaded component into a through-hole of a board.

BACKGROUND ART

It is desirable for a board work machine to appropriately mount a component at a specified position of a board. In the patent literature below, technology is disclosed for appropriately mounting a component at a specified position of a board.

Patent literature 1: JP-A-H5-114800

BRIEF SUMMARY

Technical Problem

According to technology disclosed in the above patent literature, it is possible to a certain extent to appropriately mount a component at a specified position of a board. However, although a general mounting method of mounting a component to a board is disclosed in the above patent literature, a specific mounting method of mounting a leaded component to a board is not disclosed. With regard to this, an object of the present disclosure is specifically for a leaded component among the components to be mounted on the board and is for appropriately inserting a lead of a leaded component into an insertion hole of a board.

Solution to Problem

To solve the above problems, a board work machine of the present disclosure includes: a holding tool configured to hold a leaded component; a moving device configured to move the holding tool along an upper surface of a board; and a control device configured to control operation of the moving device, wherein the control device, by controlling operation of the moving device, moves a lead of the leaded component being held by the holding tool in a state contacting the upper surface of the board so as to insert the lead into a through-hole formed in the board.

Also, to solve the above problems, an insertion method of the present disclosure is an insertion method for inserting a lead of a leaded component into a through-hole of a board, the insertion method including: holding the leaded component with a holding tool of a board work machine; moving the holding tool with a holding device along an upper surface of the board; and moving the lead of the leaded component held by the holding tool in a state contacting the upper surface of the board so as to insert the lead into the through-hole of the board.

Advantageous Effects

With a board work machine and an insertion method of the present disclosure, when inserting a lead of a leaded component into a through-hole of a board, the lead is moved in a state contacting an upper surface of the board. Accordingly, it is possible to insert the lead into the through-hole even in a case in which the lead contacts the upper surface of the board without being inserted directly into the through-hole.

DESCRIPTION OF PREFERRED EMBODIMENTS

The following describes in detail referring to the figures an example embodiment of the present disclosure.

Configuration of Component Mounter

Figure 1:
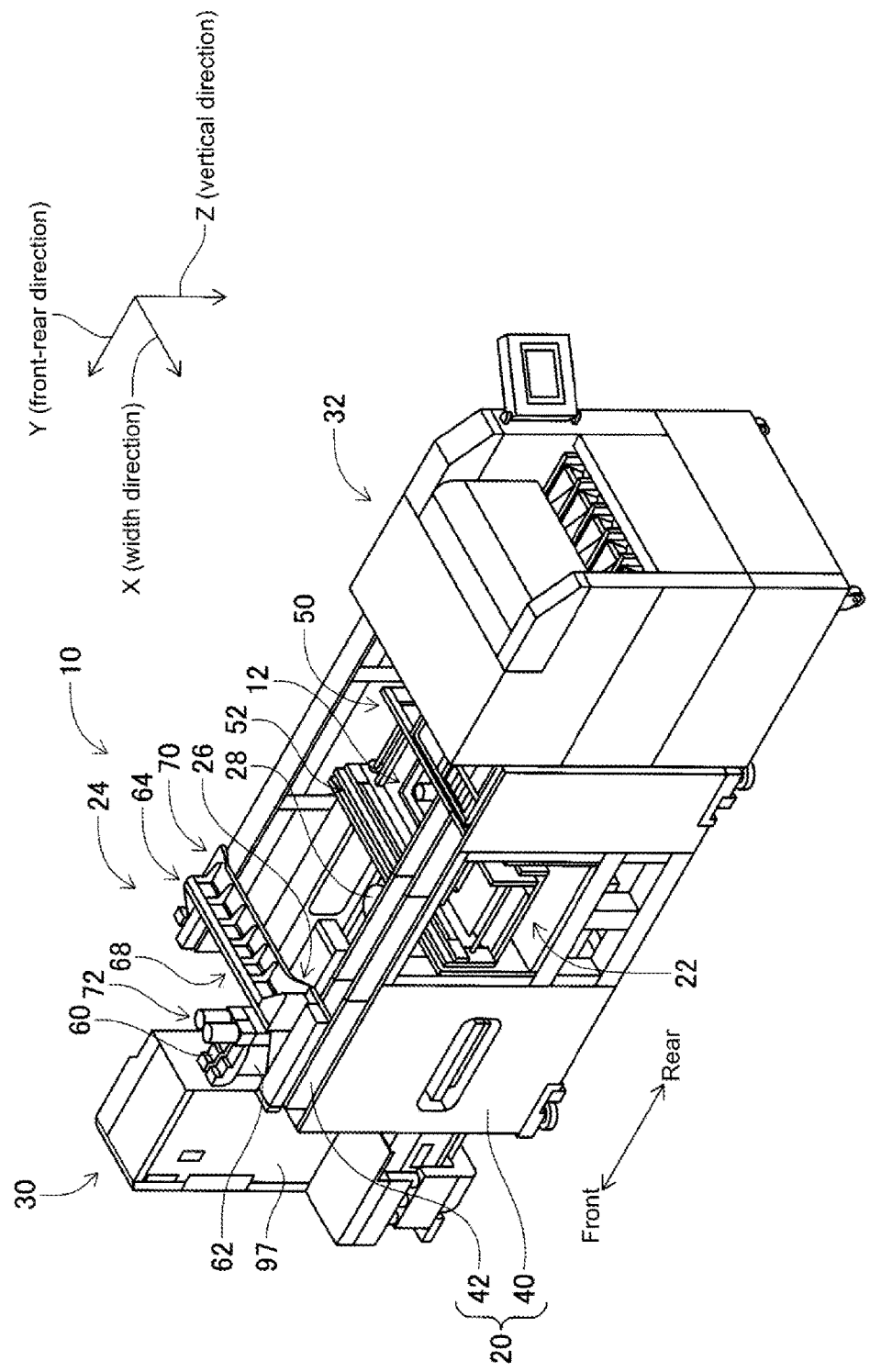
FIG. 1 is a perspective view of a component mounter.

FIG. 1 shows component mounter 10. Component mounter 10 performs work of mounting components on circuit board 12. Component mounter 10 is provided with device main body 20, board conveying and holding device 22, component mounting device 24, mark camera 26, component camera 28, component supply device 30, loose component supply device 32, cut and clinch device (refer to FIG. 6) 34, and control device (refer to FIG. 10) 36. Note that, examples of circuit board 12 include circuit boards and boards with a three-dimensional construction, examples of a circuit board being a printed wiring board or a printed circuit board.

Device main body 20 is configured from frame section 40 and beam section 42 that is mounted on the frame section 40. Board conveying and holding device 22 is positioned centrally inside frame section 40 in the front-rear direction, and includes conveyance device 50 and clamp device 52. Conveyance device 50 conveys circuit board 12, and clamp device 52 holds circuit board 12. Thus, board conveying and holding device 22 conveys circuit board 12 and fixedly holds circuit board 12 at a specified position. Note that, in the descriptions below, the conveyance direction of circuit board 12 is referred to as the X direction, the direction horizontally perpendicular to the X direction is referred to as the Y direction, and the vertical direction is referred to as the Z direction. That is, the width direction of component mounter 10 is the X direction, and the front-rear direction is the Y direction.

Component mounting device 24 is provided on beam section 42, and includes work heads 60 and 62 and work head moving device 64. Work head moving device 64 includes X-direction moving device 68, Y-direction moving device 70, and Z-direction moving device 72. Work heads 60 and 62 are moved together to any position on frame 40 by X-direction moving device 68 and Y-direction moving device 70. Also, work heads 60 and 62 are detachably attached to sliders 74 and 76 respectively, and Z-direction moving device 72 moves sliders 74 and 76 in a vertical direction individually. That is, work heads 60 and 62 are moved in a vertical direction individually by Z-direction moving device 72.

Figure 2:
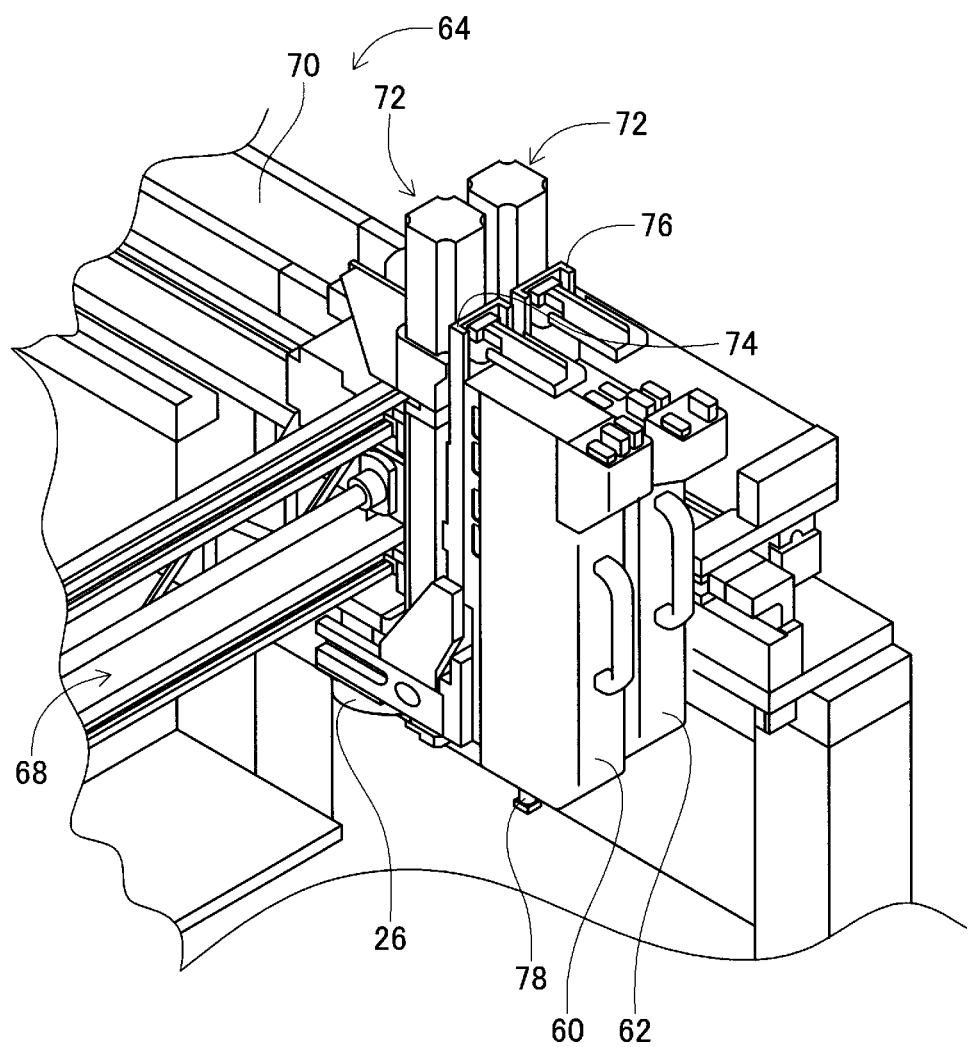
FIG. 2 is a perspective view of a component mounting device.
Figure 3:
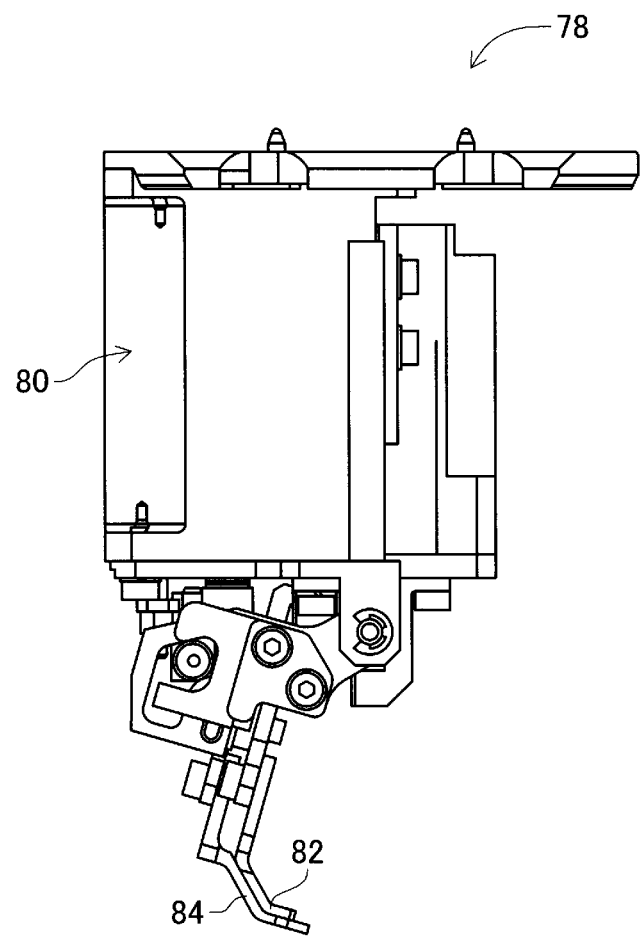
FIG. 3 is a side view of a component holding tool.
Figure 4:
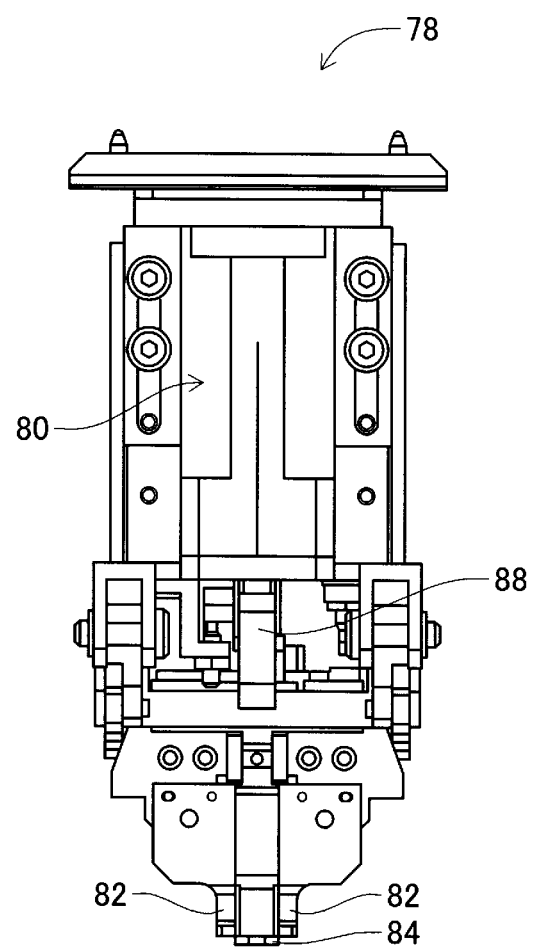
FIG. 4 is a front view of the component holding tool.
Figure 5:
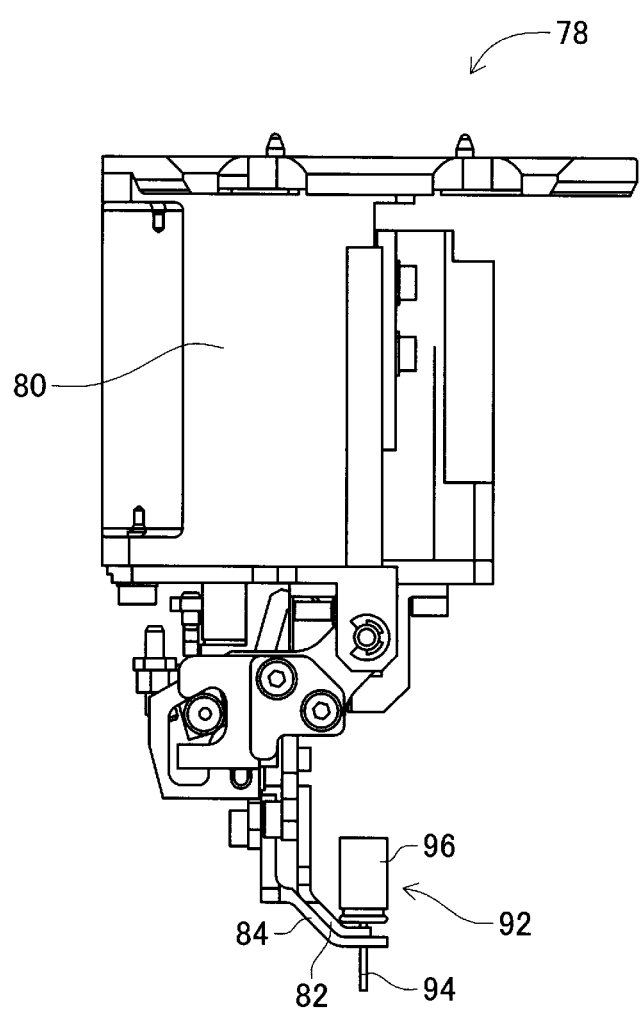
FIG. 5 is a side view of the component holding tool when holding a leaded component.

Also, as shown in FIG. 2, component holding tool 78 is attached to the bottom surface of each work head 60 and 62. Component holding tool 78 is for holding leads of a leaded component, and as shown in FIGS. 3 to 5, includes main body section 80, pair of claws 82, support plate 84, opening and closing device (refer to FIG. 10) 86, pusher 88, and air cylinder (refer to FIG. 10) 90. Note that, FIG. 3 is a side view of component holding tool 78, FIG. 4 is a front view of component holding tool 78, and FIG. 5 is a side view of component holding tool 78 holding leaded component 92.

The pair of claws 82 are swingably held by main body section 80, and by operation of opening and closing device 86 the tip sections of the pair of claws 82 are moved towards and away from each as the claws swing. Recesses (not shown) with a size in accordance with the lead diameter of lead 94 of leaded component 92 that is to be held are formed on the insides of the pair of claws 82. Also, support plate 84 is positioned between the pair of claws 82, and swings together with the pair of claws 82. When this occurs, support plate 84 enters between the pair of leads 94 of leaded component 92. Also, by the pair of claws 82 moving towards support plate 84, each of the pair of leads 94 of leaded component 92 is sandwiched between the recess of claw 82 and support plate 84. Thus, as shown in FIG. 5, leaded component 92 is held by the pair of claws 82 at a base end of leads 94, that is, at the end close to component main body 96 of leaded component 92. Here, bending and curvature of leads 94 is corrected to a certain extent by leads 94 being gripped by the recesses of claws 82 and support plate 84.

Also, pusher 88 is held by main body section 80 to be vertically movable, and is raised and lowered by operation of air cylinder 90. Note that, pusher 88, when lowered, contacts component main body 96 of leaded component 92 held by the pair of claws 82, so as to push leaded component 92 down. Here, the sandwiching force on leads 94 by the pair of claws 82 is reduced to a level at which leads 94 slip in a state sandwiched by the pair of claws 82 when leaded component 92 is pushed by pusher 88. Specifically, for example, in a case in which opening and closing device 86 is operated by air pressure, the air pressure during pusher operation is controlled, and in a case in which opening and closing device is operated by an electromagnetic motor, the supply of electric power during pusher operation is controlled.

Further, as shown in FIG. 2, mark camera 26 is attached to slide 74 in a state facing downwards, and is moved in the X direction, Y direction, and Z direction together with work head 60. Thus, mark camera 26 images any position on frame section 40. As shown in FIG. 1, component camera 28 is provided in a state facing upwards on frame section 40 between board conveying and holding device 22 and component supply device 30. Thus, component camera 28 images a component held by component holding tool 66 of work heads 60 and 62.

Component supply device 30 is provided at an end of frame section 40 in the front-rear direction. Component supply device 30 includes tray-type component supply device 97 and feeder-type component supply device (refer to FIG. 10) 98. Tray-type component supply device 97 supplies components in a state arranged in a tray. Feeder-type component supply 98 device supplies components via a tape feeder or stick feeder (not shown).

Loose component supply device 32 is provided at the other end of frame section 40 in the front-rear direction. Loose component supply device 32 lines up multiple components that are in a scattered state, and supplies the components in a lined-up state. That is, this device arranges multiple components that have random orientations to have a specified orientation and supplies the components in the specified orientation.

Note that, components supplied by component supply device 30 and loose component supply device 32 may include electronic circuit components, configuration components of solar panels, configuration components of power modules, and the like. Also, electronic circuit components include components with leads and components without leads.

Figure 6:
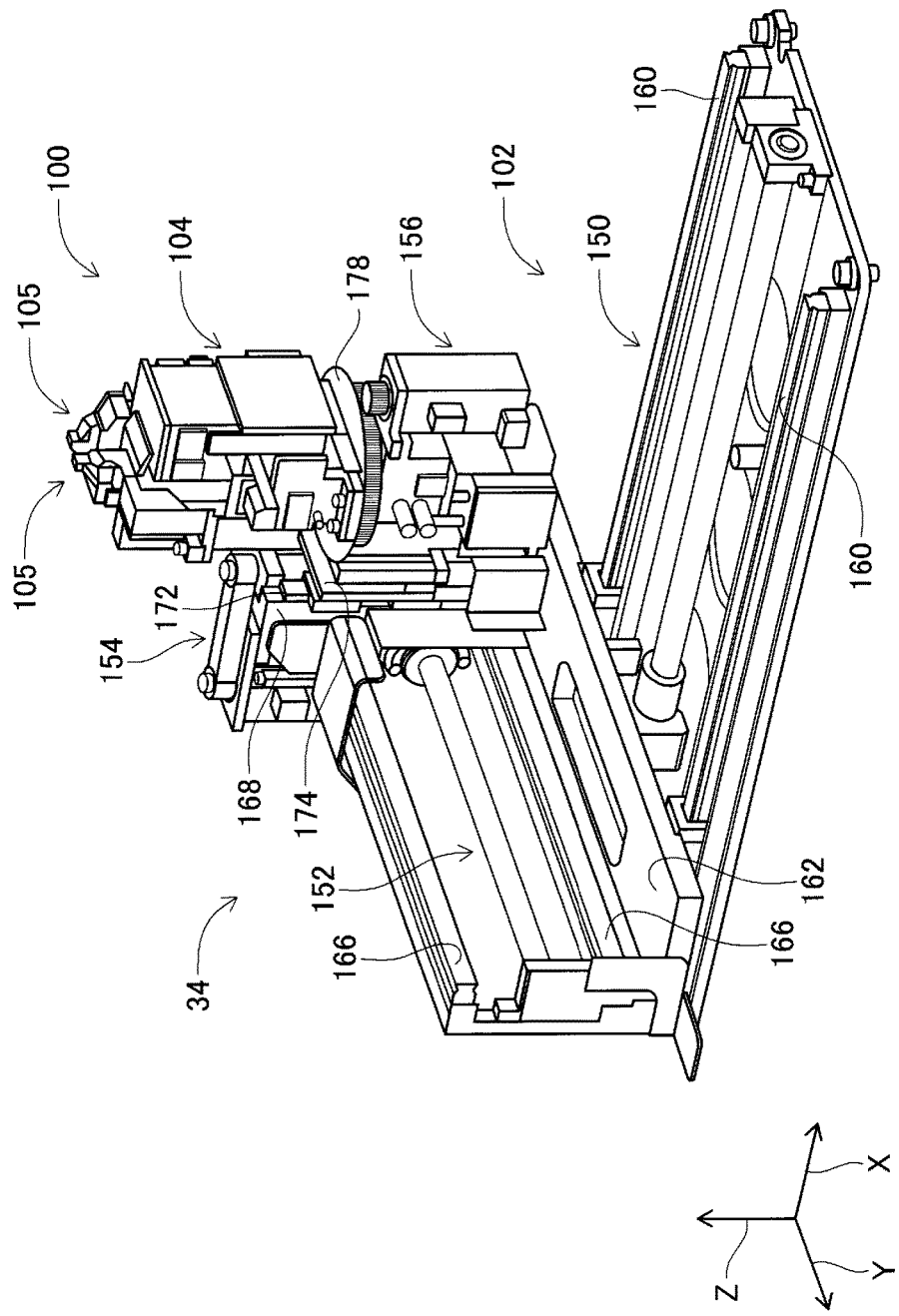
FIG. 6 is a perspective view of a cut and clinch device.
Figure 7:
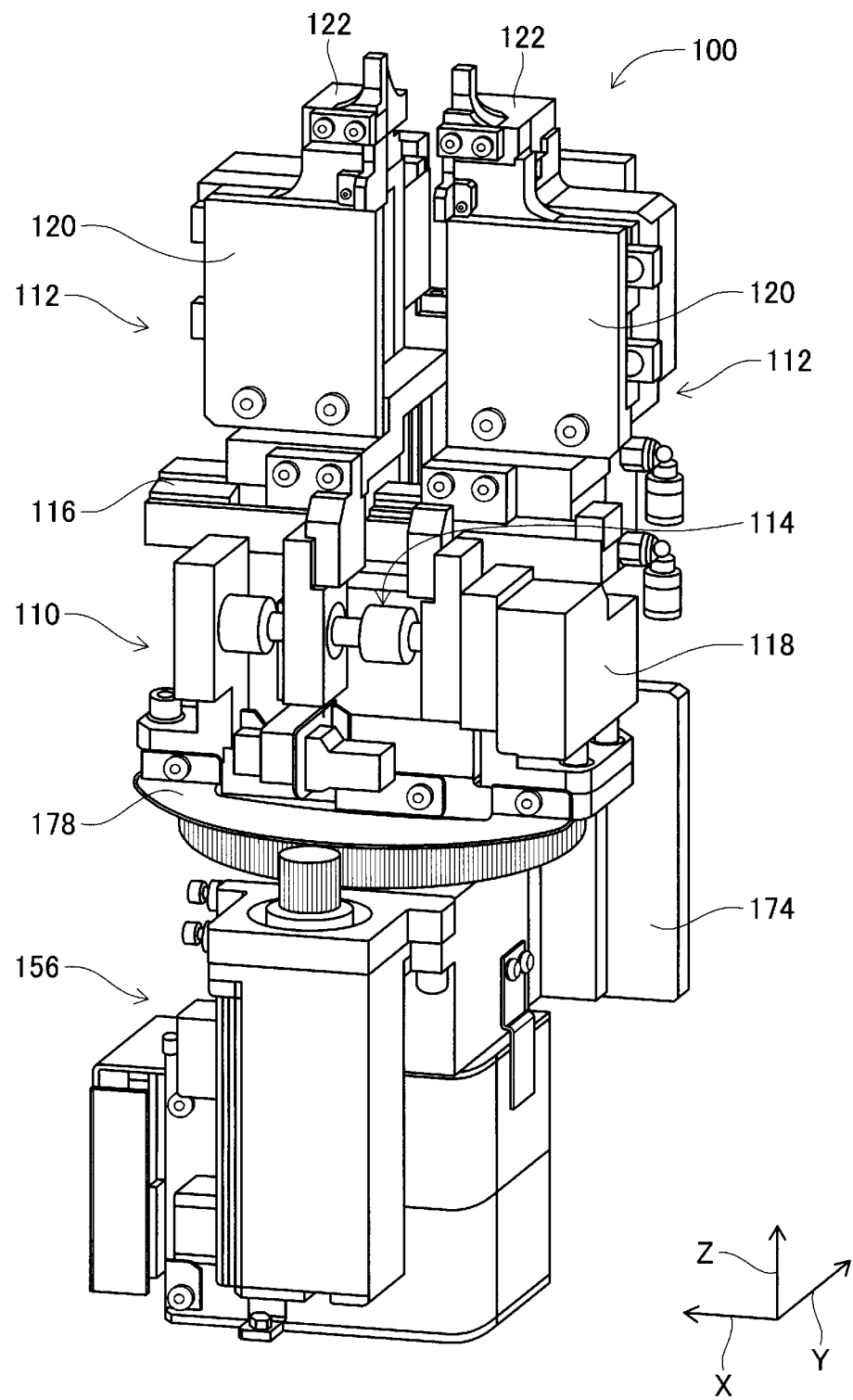
FIG. 7 is a perspective view of a cut and clinch unit.

Cut and clinch device 34 is arranged below conveyance device 50 and, as shown in FIG. 6, includes cut and clinch unit 100 and unit moving device 102. As shown in FIG. 7, cut and clinch unit 100 includes unit main body 110, pair of slide bodies 112, and pitch changing mechanism 114. At an upper end of unit main body 110, slide rail 116 is arranged extending in the X direction. The pair of slide bodies 112 is supported by slide rail 116 so as to be movable. By this, the pair of slide bodies 112 move towards and away from each other in the X direction. Also, pitch changing mechanism 114 includes electromagnetic motor 118, and the distance between the pair of slide bodies 112 can be controllably changed by operation of electromagnetic motor 118.

Figure 8:
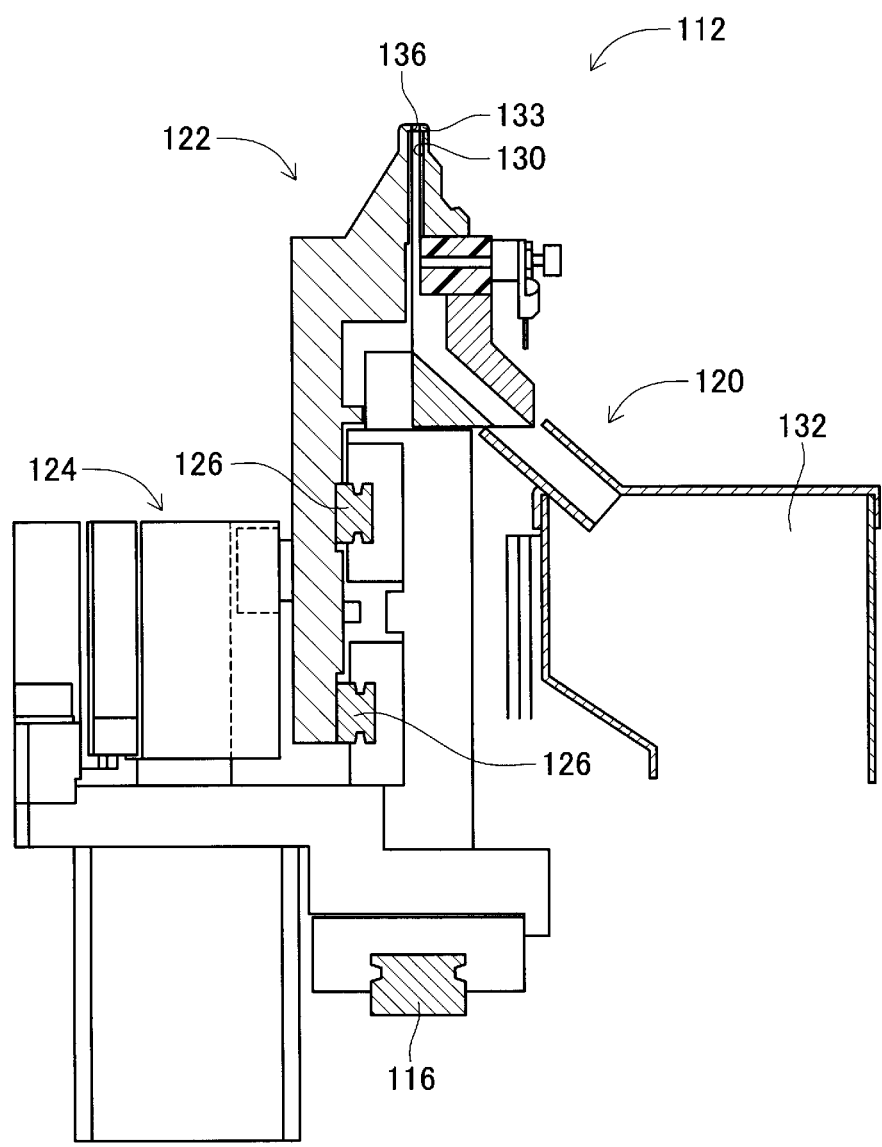
FIG. 8 is a cross section of a slide body.

Also, as shown in FIG. 8, each of the pair of slide bodies 112 includes fixed body section 120, movable section 122, and slide device 124, and is supported at fixed body section 120 so as to be slidable on slide rail 116. Two slide rails 126 are fixed to the rear side of fixed body section 120 extending in the X direction, and movable section 122 is slidably supported by those two slide rails 126. Thus, movable section 122 slides in the X direction with respect to fixed section 120. Also, slide device 124 includes electromagnetic motor (refer to FIG. 10) 128, and movable section 122 is controllably slid by operation of electromagnetic motor 128.

Also, the upper end section of fixed body section 120 is formed tapered towards the end, and first insertion hole 130 is formed so as to pierce the upper end section in a vertical direction. The upper end of first insertion hole 130 opens at the upper end surface of fixed section 120, and the edge that opens to the upper end surface is formed as fixed blade (refer to FIG. 16) 131. Also, the lower end of first insertion hole 130 opens to a side surface of fixed section 120, and discard box 132 is provided below the opening to the side surface.

Figure 9:
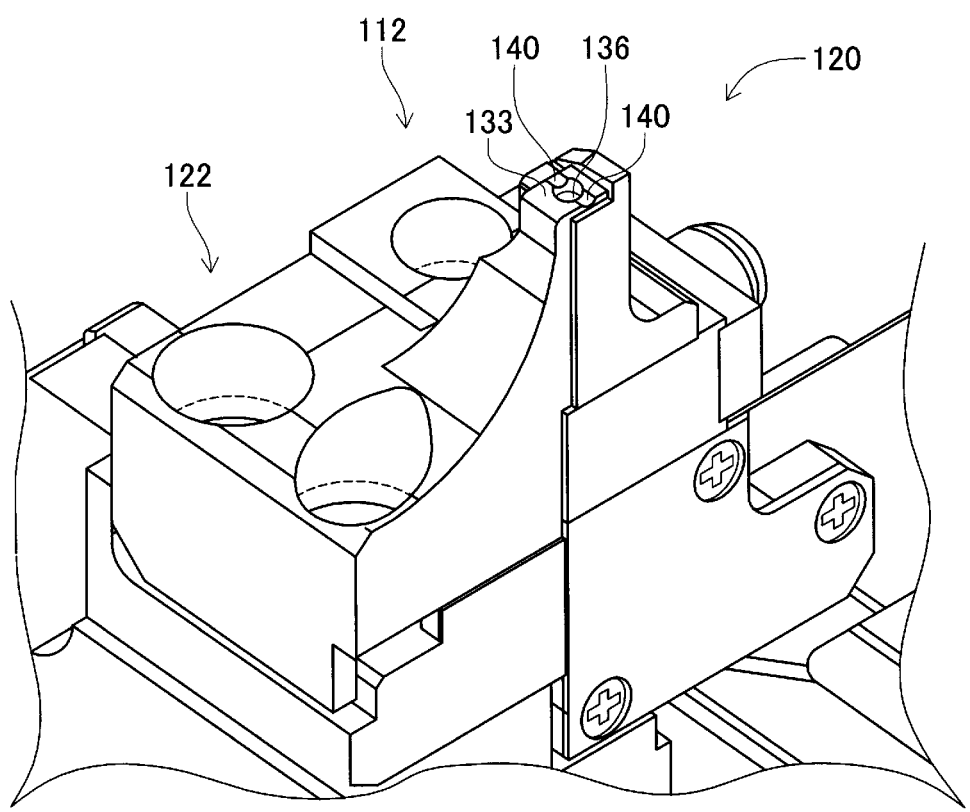
FIG. 9 is an enlarged view of the slide body.

Further, as shown in FIG. 9, an upper end section of movable section 122 is also formed tapered towards the end, and L-shaped curved section 133 is formed at the upper end section of movable section 122. Curved section 133 extends upwards of the upper end surface of fixed section 120, and there is slight clearance between curved section 133 and the upper end of main body section 120. And, first insertion hole 130 that opens at the upper end surface of fixed section 120 is covered by curved section 133, and second insertion hole 136 is formed in curved section 133 so as to face first insertion hole 130.

Note that, second insertion hole 136 pierces through curved section 133 in a vertical direction, and an internal surface of second insertion hole 136 is a tapered surface configured with a diameter that gets smaller going down. Further, the edge of second insertion hole 136 that opens to the lower end surface of curved section 133 is formed as movable blade 138 (refer to FIG. 16). Further, guide groove 140 is formed in the upper end surface of curved section 133 extending in the X-axis direction, that is, the sliding direction of movable section 122. Guide groove 140 is formed to straddle the opening of second insertion hole 136, and guide groove 140 and second insertion hole 136 are linked. Also, guide groove 140 is open at both side surfaces of curved section 133.

Also, as shown in FIG. 6, unit moving device 102 includes X-direction moving device 150, Y-direction moving device 152, Z-direction moving device 154, and rotation device 156. X-direction moving device 150 includes slide rail 160 and X slider 162. Slide rail 160 extends in the X direction, and X slider 162 is slidably supported on X slide rail 160. X slider 162 moves in the X direction by the driving of electromagnetic motor (refer to FIG. 10) 164. Y-direction moving device 152 includes slide rail 166 and Y slider 168. Slide rail 166 is arranged on X slider 162 extending in the Y direction, and Y slider 168 is slidably supported on slide rail 166. Also, Y slider 168 moves in the Y direction by the driving of electromagnetic motor (refer to FIG. 10) 170. Z-direction moving device 154 includes slide rail 172 and Z slider 174. Slide rail 172 is arranged on Y slider 168 extending in the Z direction, and Z slider 174 is slidably supported on slide rail 172. Also, Z slider 174 moves in the Z direction by the driving of electromagnetic motor (refer to FIG. 10) 176.

Further, rotation device 156 includes rotating table 178 that is roughly disc-shaped. Rotating table 178 is supported by Z slider 174 so as to be rotatable around its own center, and is rotated by the driving of electromagnetic motor (refer to FIG. 10) 180. Cut and clinch unit 100 is arranged on rotating table 178. According to such a configuration, cut and clinch unit 100 can be moved to any position by X-direction moving device 150, Y-direction moving device 152, and Z-direction moving device 154, and can be rotated to any angle by rotation device 156. Thus, cut and clinch unit 100 can be positioned at any position under circuit board 12 held by clamp device 52.

Figure 10:
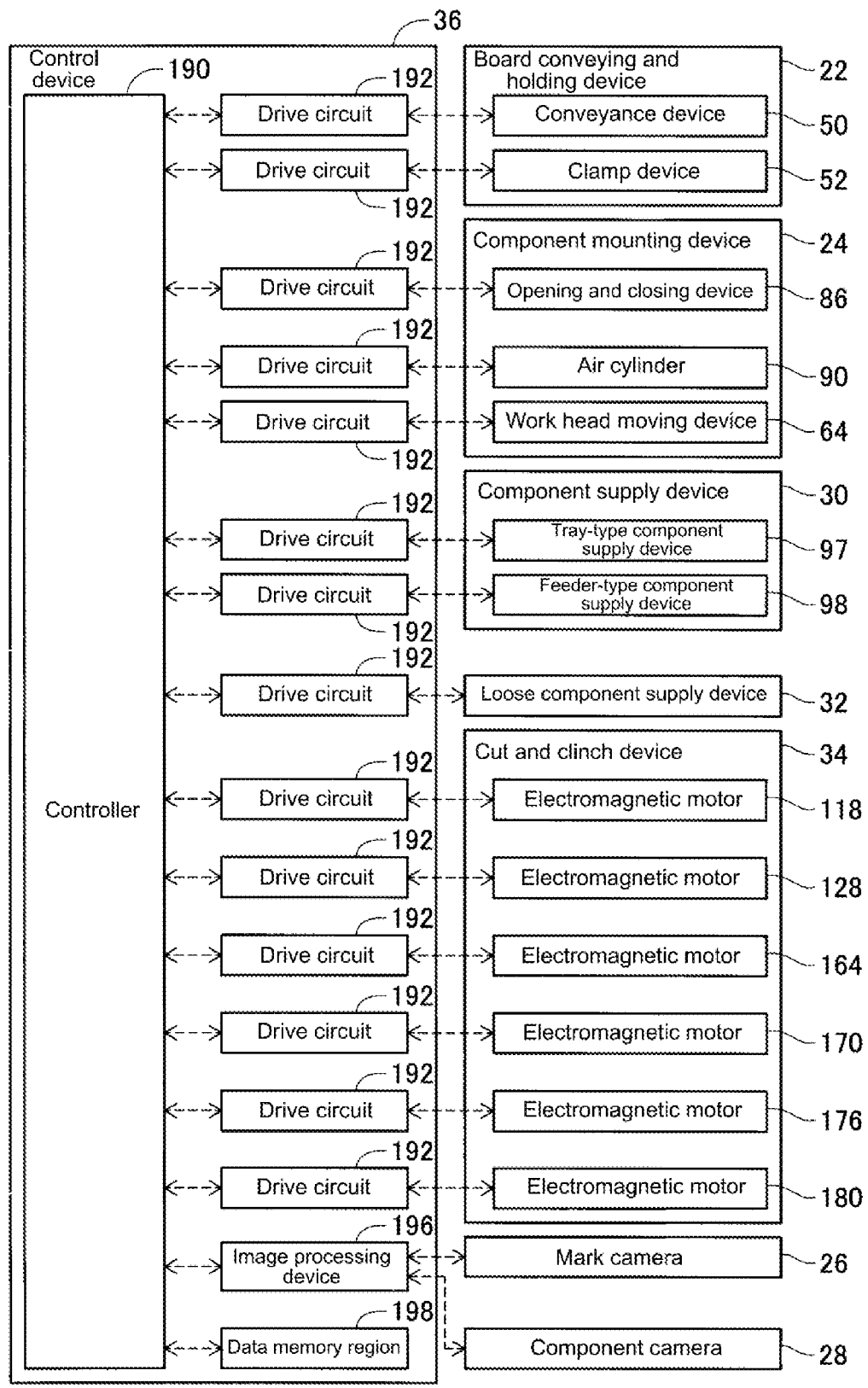
FIG. 10 is a block diagram showing a control device.

As shown in FIG. 10, control device 36 is provided with controller 190, multiple drive circuits 192, image processing device 196, and data memory region 198. The multiple drive circuits 192 are connected to conveyance device 50, clamp device 52, work head moving device 64, opening and closing device 86, air cylinder 90, tray-type component supply device 97, feeder-type component supply device 98, loose component supply device 32, and electromagnetic motors 118, 128, 164, 170, 176, and 180. Controller 190 is provided with a CPU, ROM, RAM, and so on, is formed mainly from a computer, and is connected to the multiple drive circuits 192. By this, operation of board conveying and holding device 22, component mounting device 24, and so on is controlled by controller 190. Controller 190 is also connected to image processing device 196. Image processing device 196 is for processing image data acquired by mark camera 26 and component camera 28, and controller 190 acquires various information from the image data. Further, controller 190 is connected to data memory region 198 as well. Data memory region 198 memorizes various pieces of information required for performing mounting work, and controller 190 acquires the information required during mounting from data memory region 198.

Component Mounter Operation

Component mounter 10, according to the above configuration, mounts components on circuit board 12 held by board conveying and holding device 22. With component mounter 10, it is possible to mount various components to circuit board 12; descriptions are given below of a case in which leaded components 92 are mounted on circuit board 12.

Specifically, circuit board 12 is conveyed to a work position, and is fixedly held at that position by clamp device 52. Also, cut and clinch unit 100 moves below circuit board 12. Cut and clinch unit 100 is moved such that coordinates in the XY directions of second insertion hole 136 of movable section 122 and coordinates in the XY directions of through-holes (refer to FIG. 11) 200 of circuit board 12 match, the upper surface of movable section 122 and the lower surface of circuit board 12 do not contact each other, and the upper surface of movable section 122 is slightly below the lower surface of circuit board 12.

Specifically, with cut and clinch unit 100, the distance between the pair of slide bodies 112 is adjusted by pitch changing mechanism 114 such that the distance between the pair of second insertion holes 136 of movable section 122 of slide body 122 is the same as the distance between the two through-holes 200 formed in circuit board 12. And, by operation of unit moving device 102, cut and clinch unit 100 is moved in the XYZ directions and rotated. Thus, the coordinates in the XY directions of second insertion hole 136 of movable section 122 and coordinates in the XY directions of through-holes 200 of circuit board 12 match, the upper surface of movable section 122 and the lower surface of circuit board 12 do not contact each other, and the upper surface of movable section 122 is slightly below the lower surface of circuit board 12.

Also, when circuit board 12 is fixedly held by clamp device 52, mark camera 26 moves above circuit board 12 and images circuit board 12. And, controller 190 calculates information related to a holding position of a circuit board and the like based on the imaging data. Also, component supply device 30 or loose component supply device 32 supplies leaded components 92 at a specified supply position. Then, one of the work heads 60 or 62 moves above the component supply position and holds a leaded component 92 using component holding tool 78.

Next, when leaded component 92 is held by component holding tool 78, in a conventional device, the leaded component 92 held by component holding tool 78 is imaged, and the insertion of leads 94 into through-holes 200 is performed based on the image data. However, with component mounter 10, insertion of leads 94 into through-holes 200 is performed without imaging leaded component 92 each time insertion is performed. In detail, the holding posture, holding position and tip position of leads 94 of the leaded component 92 held by component holding tool 78 are imaged in advance by the same type of component 92 being held by the same type of component 78, the image data being memorized in data memory region 198 of control device 36. Also, data memory region 198 includes data related to leaded components 92, for example, component model data, and part data. Further, data related to the forming position of through-holes 200 of circuit board 12 is also memorized in data memory region 198. And, assuming that the forming pitch of through-holes 200 and the pitch of leads 94 is the same, and that the holding state of leaded component 92 by component holding tool 78 is reproducible, it is possible to make the coordinates of the tip positions of leads 94 match with the positions of through-holes 200 in the XY directions. That is, the tips of leads 94 and through-holes 200 can overlap in the vertical direction. In particular, as above, with component holding tool 78, components are held in a state with curvature or the like of leads 94 corrected, therefore the reproducibility of the holding state of leaded component 92 held by component holding tool 78, that is, the reproducibility of the tip positions of leaded component 92 held by component holding tool 78, the reproducibility of the grasping position of leaded component 92 held by component holding tool 78, and the reproducibility of the posture of leaded component 92 held by component holding tool 78, and the like is very high, meaning that it is possible to have the tips of leads 94 overlapping through-holes 200 in the vertical direction.

Thus, operation of X-direction moving device 68 and Y-direction moving device 70 is controlled based on data memorized in data memory region 198 such that the tip positions of leads 94 overlap with the positions of through-holes 200 of circuit board 12. Also, leads 94 of leaded component 92 are pressed by pusher 88 towards circuit board 12 in a state sandwiched by support plate 84 and claws 82 of component holding tool 78. Accordingly, leads 94 of leaded component 92 are inserted into through-holes 200 of circuit board 12.

Figure 11:
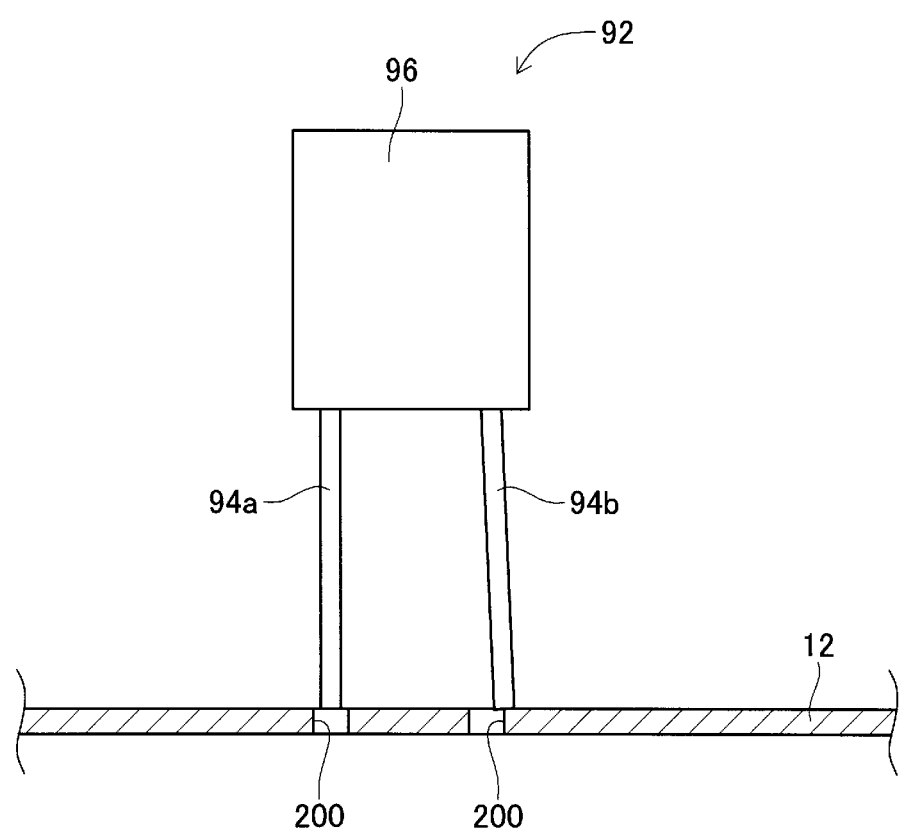
FIG. 11 is a conceptual view showing a board and leaded component during insertion of leads.

However, in a case in which operation of X-direction moving device 68 and Y-direction moving device 70 is controlled based on data memorized in data memory region 198, because it is assumed that the grasping position of leaded component 92, the tip positions of leads 94 of leaded component 92, and the like are reproducible, for example, as shown in FIG. 11, there are cases in which although the coordinates of the tip position of a single lead 94a out of the pair of leads 94 matches the position of through-hole 200 in the XY directions, the coordinates of the tip position of the other lead 94b do not match the position of through-hole 200 in the XY directions. Specifically, for example, there are cases in which one of the pair of leads 94 is deformed such that the coordinates of the tip position of the lead 94 do not match the position of the corresponding through-hole 200 of the pair of through-holes 200 of circuit board 12 in the XY directions, or in which the coordinates of the tip positions of both leads 94 of the pair of leads 94 do not match the positions of both of the pair of through-holes 200 of circuit board 12 in the XY directions. In such a case, when leaded component 92 is lowered to insert leads 94 into through-holes 200, there is a tendency for lead 94b to bend and be damaged. Note that, the leaded component 92 shown in FIG. 11 is imaged by component camera 28, and in a case in which operation of X-direction moving device 68 and Y-direction moving device 70 is controlled based on that image data, it is possible to match the coordinates of the tip positions of both leads 94a and 94b with through-holes 200 in the XY directions.

Thus, after operation of X-direction moving device 68 and Y-direction moving device 70 is controlled based on data memorized in data memory region 198 such that the tip positions of leads 94 match the positions of through-holes 200 of circuit board 12, leaded component 92 is lowered, and when leads 94 are pressed against circuit board 12, air cylinder 90 that is a drive source of pusher 88 operates pusher 88 at a specified air pressure. This specified air pressure is set to cause a pressing force of a level that does not plastically deform leads 94 when they are pressed against circuit board 12. Therefore, the pressing force of lead 94 against circuit board 12 when lead 94 is contacting the upper surface of circuit board 12 is set within a range that elastically deforms lead 94. That is, the pressing force of lead 94 on circuit board 12 is equal to or less than the elastic limit of lead 94. Note that, the elastic limit is a tension limit value at which any object under deformation due to the applying of tension is returned to its original form when the tension is released.

Figure 12:
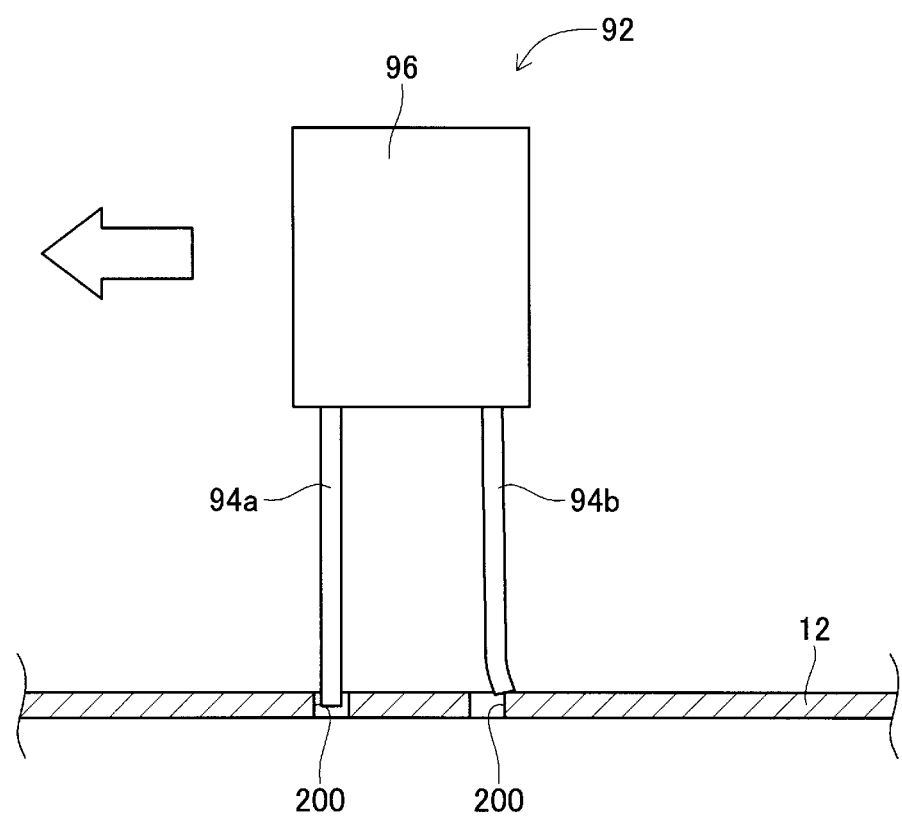
FIG. 12 is a conceptual view showing a board and leaded component during insertion of leads.

In this manner, as shown in FIG. 12, by pressing leads 94 against circuit board 12, lead 94b contacts the edge of through-hole 200, but elastically deforms without plastically deforming. On the other hand, a portion of the tip of lead 94 is inserted inside through-hole 200. Then, while leads 94 are pressed against circuit board 12, in a state contacting the upper surface of circuit board 12, work head 60 or 62 is moved in the XY directions. That is, in state with leads 94 contacting the upper surface of circuit board 12 and in an elastically deformed state, work head 60 or 62 is moved along the upper surface of circuit board 12.

Figure 13:
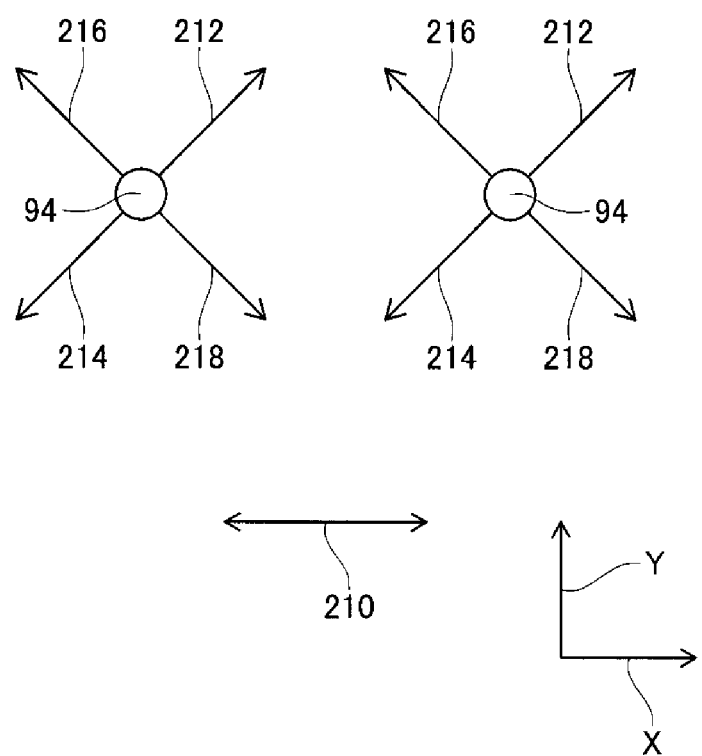
FIG. 13 is a conceptual view showing a movement direction of a lead.

Specifically, as shown in FIG. 13, operation of X-direction moving device 68 and Y-direction moving device 70 is controlled such that leads 94 are moved in a direction 45 rotated with respect to the direction in which the pair of leads 94 are lined up (the direction in which arrow 210 extends) in a plane in the XY direction. That is, leaded component 92 is moved in the XY directions such that leads 94 are moved in the direction in which arrow 212 extends. Note that, here, the movement distance of leads 94 is A, with movement distance A being a distance approximately equal to the diameter of leads 94. That is, if the diameter of lead 94 is 0.5 mm, movement distance A is also 0.5 mm. And, after leads 94 are moved in the direction of arrow 212, they are returned to their original positions (pre-movement positions). That is, leads 94, after being moved from the pre-movement positions by movement distance A in the direction of arrow 212, are moved by movement distance A in the direction opposite to arrow 212.

Further, leads 94 are moved by movement amount A in the direction opposite to arrow 212 (direction in which arrow 214 extends) and are moved back to their original positions (pre-movement positions). That is, leads 94, after being moved from the pre-movement positions by movement distance A in the direction of arrow 214, are moved by movement distance A in the direction opposite to arrow 214. By this, leaded component 92 is moved such that leads 94 are oscillated once across width A in the direction in which arrow 212 and arrow 214 extend.

Next, when one oscillation of leads 94 in the direction in which arrow 212 and arrow 214 extend is complete, leads 94 are moved by distance A in the direction rotated 90 degrees in the plane of arrows 212 and 214 and the XY directions (the direction in which arrow 216 extends), and then returned to their original positions (pre-movement positions). That is, leads 94, after being moved from the pre-movement positions by movement distance A in the direction of arrow 216, are moved by movement distance A in the direction opposite to arrow 216. Further, leads 94 are moved by movement amount A in the direction opposite to arrow 216 (direction in which arrow 218 extends) and are moved back to their original positions (pre-movement positions). That is, leads 94, after being moved from the pre-movement positions by movement distance A in the direction of arrow 218, are moved by movement distance A in the direction opposite to arrow 218. By this, leaded component 92 is moved such that leads 94 are oscillated once across width A in the direction in which arrow 216 and arrow 218 extend.

In other words, leads 94 are oscillated once across width A in the direction in which arrow 212 and arrow 214 extend, then are oscillated once across width A in the direction in which arrow 216 and arrow 218 extend. Further, leads 94 are oscillated once across width (1.5×A) in the direction in which arrow 212 and arrow 214 extend, then are oscillated once across width (1.5×A) in the direction in which arrow 216 and arrow 218 extend. In other words, leads 94 are oscillated once each in the direction in which arrow 212 and arrow 214 extends, and the direction in which arrow 216 and arrow 218 extends, across a width 1.5 times the size of A.

Further, after leads 94 have been oscillated across the width 1.5 times the size, they are oscillated once each in the direction in which arrow 212 and arrow 214 extends, and the direction in which arrow 216 and arrow 218 extends across a width 2 times the size of A. That is, leads 94 are oscillated once across width (2×A) in the direction in which arrow 212 and arrow 214 extend, then are oscillated once across width (2×A) in the direction in which arrow 216 and arrow 218 extend. By this, leads 94 are oscillated across width A in two directions (the direction in which arrow 212 and arrow 214 extends, and the direction in which arrow 216 and arrow 218 extends), then are oscillated in two directions across width (1.5×A), then are oscillated in two directions across width (2×A). Note that, the time required for the above oscillation of leads 94 is approximately 0.5 to 2.0 seconds. Also, while leads 94 are being oscillated, they are pressed towards circuit board 12 by pusher 88.

Figure 14:
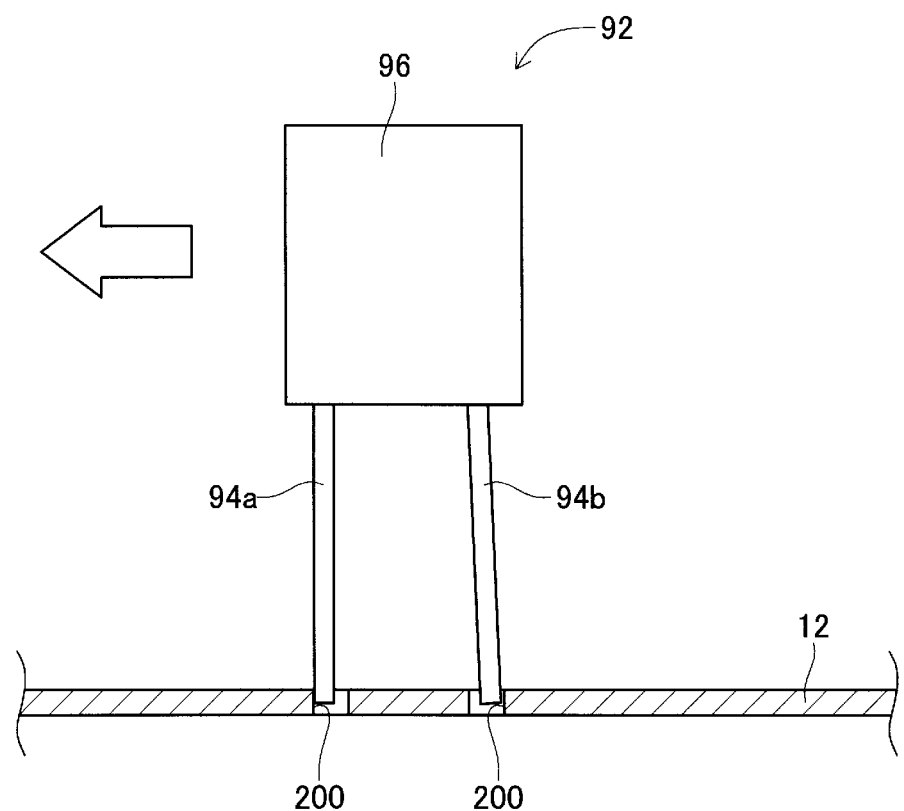
FIG. 14 is a conceptual view showing a board and leaded component during insertion of leads.
Figure 15:
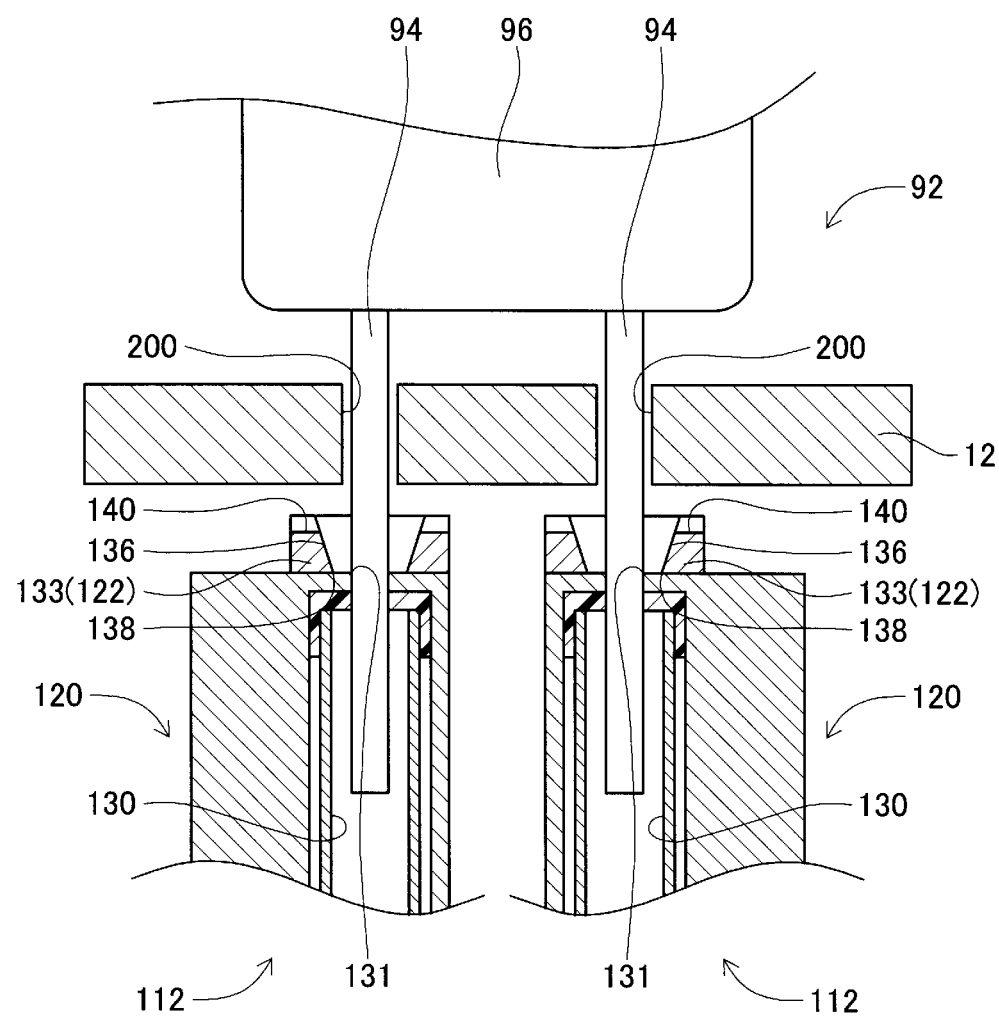
FIG. 15 is a cross section view of a cut and clinch unit immediately before leads of a leaded component are cut.

Also, when leads 94 are oscillated in the above manner, by the leads 94 being pressed against circuit board 12, lead 94a, a portion of the tip of which is inserted into through-hole 200, as shown in FIG. 14, is held in a state inserted inside through-hole 200 with the portion of the tip caught against the inner circumferential surface of through-hole 200. On the other hand, by the leads 94 being pressure against circuit board 12, lead 94b contacting an edge of through-hole 200 is inserted into through-hole 200 as the leads are oscillated in the manner described above. Here, to release the pressing of lead 94b against the edge of through-hole 200, the air pressure of air cylinder 90 that is the drive source of pusher 88 is temporarily lowered. The air pressure of air cylinder 90 is monitored, and based on changes to the air pressure, it is determined whether leads 94 have been inserted into through-holes 200. The, once leads 94 have been inserted into through-holes 200, the holding of leaded component 92 by component holding tool 78, that is, the sandwiching of leads 94 by claws 82 and support plate 84, is released. Here, because leaded component 92 is being pressed down by pusher 88, leads 94 inserted into through-holes 200 are inserted further down. By this, as shown in FIG. 15, leads 94 are inserted into second insertion holes 136 and first insertion holes 130 of slide bodies 112 of cut and clinch unit 100 via through-holes 200.

Note that, if insertion of leads 94 into through-holes 200 is not detected by the change in air pressure of air cylinder 90 by the time that oscillation of the leads is complete (oscillation for approximately 0.5 to 2.0 seconds), after oscillation of the leads 94 is complete, the leaded component 92 is collected and disposed of in a waste box (not shown) provided inside component mounter 10. Alternatively, insertion work of the leads is performed again after deformation or the like of the leads has been corrected.

In this manner, with component mounter 10, lead 94b that is in an elastically deformed state and contacting the upper surface of circuit board 12 is inserted into through-hole 200 by being moved in a searching manner around the through-hole 200. By this, it is possible to appropriately insert leads 94 into through-holes 200 without imaging leaded components 92 each time insertion work of leads 94 is performed, time wasted imaging leaded components 92 is saved, damage to leaded components 92 is prevented, and the insertion rate of leads 94 is improved.

However, with the above lead insertion work, it is assumed that the holding state of leaded components 92 by component holding tool 78 is reproducible. Therefore, for example, in a case in which the holding posture of a leaded component by a component holding tool is not stable due to the shape or the like of the leaded component 92, a case in which component main body 96 is gripped instead of leads 94, a case in which leads are gripped without being sandwiched by recesses such as those in component holding tool 78, a case in which multiple types of leaded component are held by one type of component holding tool, and the like, it is likely that the reproducibility of the holding state of the leaded component by the component holding tool will be low, therefore, in such cases, the above insertion work, that is, lead insertion work using data memorized in data memory region 198 without imaging leaded component 92, is not appropriate. Also, in a case such as in which clearance between the internal diameter of through-holes 200 of circuit board 12 and the diameter of leads 94 of leaded component 92 is small, it is likely that insertion of leads 94 into through-holes 200 will be unstable, such that insertion work of leads using data memorized in data memory region 198 is not appropriate.

Considering this, in a case in which lead insertion work using data memorized in data memory region 198 is not appropriate, leaded component 92 is imaged and insertion work is performed based on the image data. Note that, as described above, data related to leaded component 92 is memorized in data memory region 198, and a program or the like for performing mounting work is also memorized. Thus, with regard to this data, it is determined whether lead insertion work using data memorized in data memory region 198 is appropriate. Further, in a case in which it is determined that lead insertion work using data memorized in data memory region 198 is not appropriate, lead insertion work using image data is performed.

In detail, when leaded component is held by component holding tool 78, component holding tool 78 is moved above component camera 28, and leaded component 92 is imaged. Then, based on the image data of leaded component 92, the tip positions of leads 94 of leaded component 92 are calculated, and operation of X-direction moving device 68 and Y-direction moving device 70 is controlled such that the tip positions of leads 94 overlap with the positions of through-holes 200 of circuit board 12. Then, leads 94 are inserted into through-holes 200 by leaded component 92 being pressed down by pusher 88.

However, occasionally, there are cases in which the stroke of pusher 88 in the Z direction deviates due to thermal displacement of pusher 88 or the like. Also, occasionally, there are cases in which the forming positions of through-holes 200 deviate from the expected forming positions. In such cases, even if operation of X-direction moving device 68 and Y-direction moving device 70 is controlled such that the tip positions of leads 94 overlap with the positions of through-holes 200 of circuit board 12 based on the image data, when leaded component 92 is lowered, as shown in FIG. 11, lead 94b may not be inserted into through-hole 200.

Figure 16:
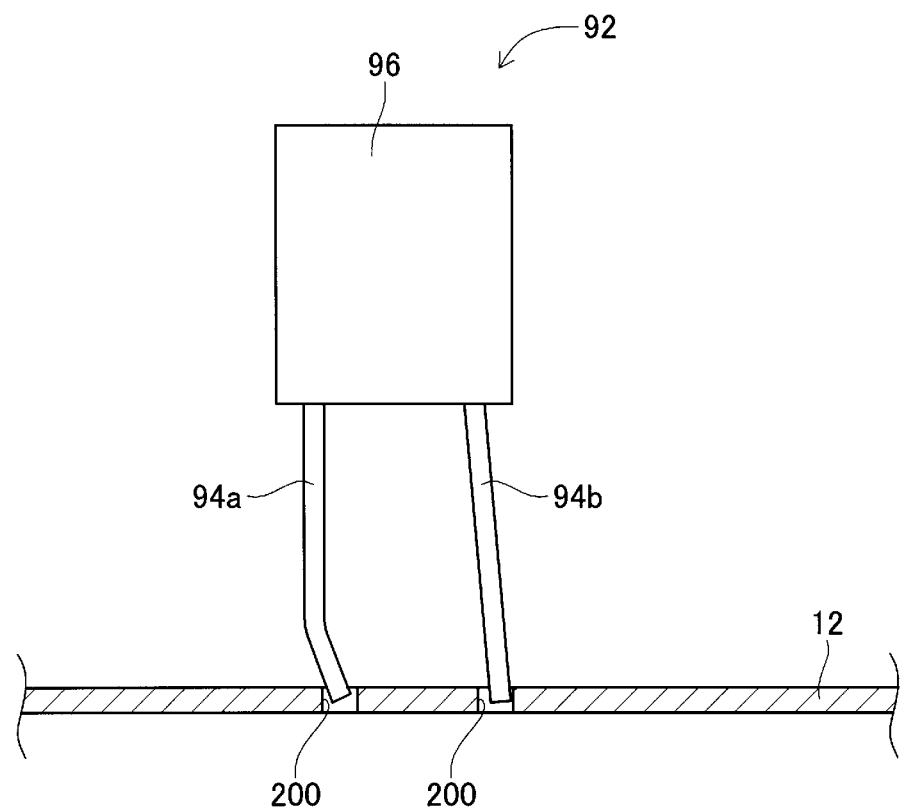
FIG. 16 is a conceptual view showing a board and leaded component during insertion of leads.

Also, for example, even if operation of X-direction moving device 68 and Y-direction moving device 70 is controlled such that the tip positions of leads 94 overlap with the positions of through-holes 200 of circuit board 12 based on the image data, as shown in FIG. 16, if warpage or the like of a central portion of leads 94 occurs, the tip sections of leads 94 may be inserted into through-holes 200, but when leaded component 92 is lowered, the central portion of lead 94a may catch on the edge of through-hole 200 such that lead 94a is not inserted. Thus, in such cases, as described above, insertion work is performed while oscillating leads 94.

In detail, after operation of X-direction moving device 68 and Y-direction moving device 70 is controlled based on data memorized in data memory region 198 such that the tip positions of leads 94 overlap with the positions of through-holes 200 of circuit board 12, leaded component 92 is lowered by operation of pusher 88. Here, the air pressure of air cylinder 90 that is the drive source of pusher 88 is monitored, and based on changes to the air pressure, it is determined whether leads 94 have been inserted into through-holes 200. If it is determined that leads 94 have been inserted into through-holes 200, leaded component 92 is lowered further. On the other hand, if it is determined that leads 94 have not been inserted into through-holes 200, leads 94 are oscillated using the above procedure.

In this manner, by oscillating leads 94, for example, lead 94b in the state shown in FIG. 11 is inserted into through-hole 200 as shown in FIG. 14. Also, lead 94a in the state shown in FIG. 16, when lead 94a is oscillated in the direction in which lead 94a is warped and in the opposite direction, the warp is canceled, and lead 94a is inserted into through-hole 200. Note that, when oscillating leads 94, the air pressure of air cylinder 90 is monitored, and based on changes to the air pressure, it is determined whether leads 94 have been inserted into through-holes 200. And, if it is determined that leads 94 have been inserted into through-holes 200, oscillation of leads 94 is stopped, and leaded component 92 is lowered further. On the other hand, if oscillation of leads 94 is completed without insertion of leads 94 into through-holes being detected, the leaded component is discarded or corrected. In this manner, when performing insertion work of leads 94 based on image data, by performing insertion work while oscillating leads 94, it is possible to improve the insertion rate of leads 94.

Figure 17:
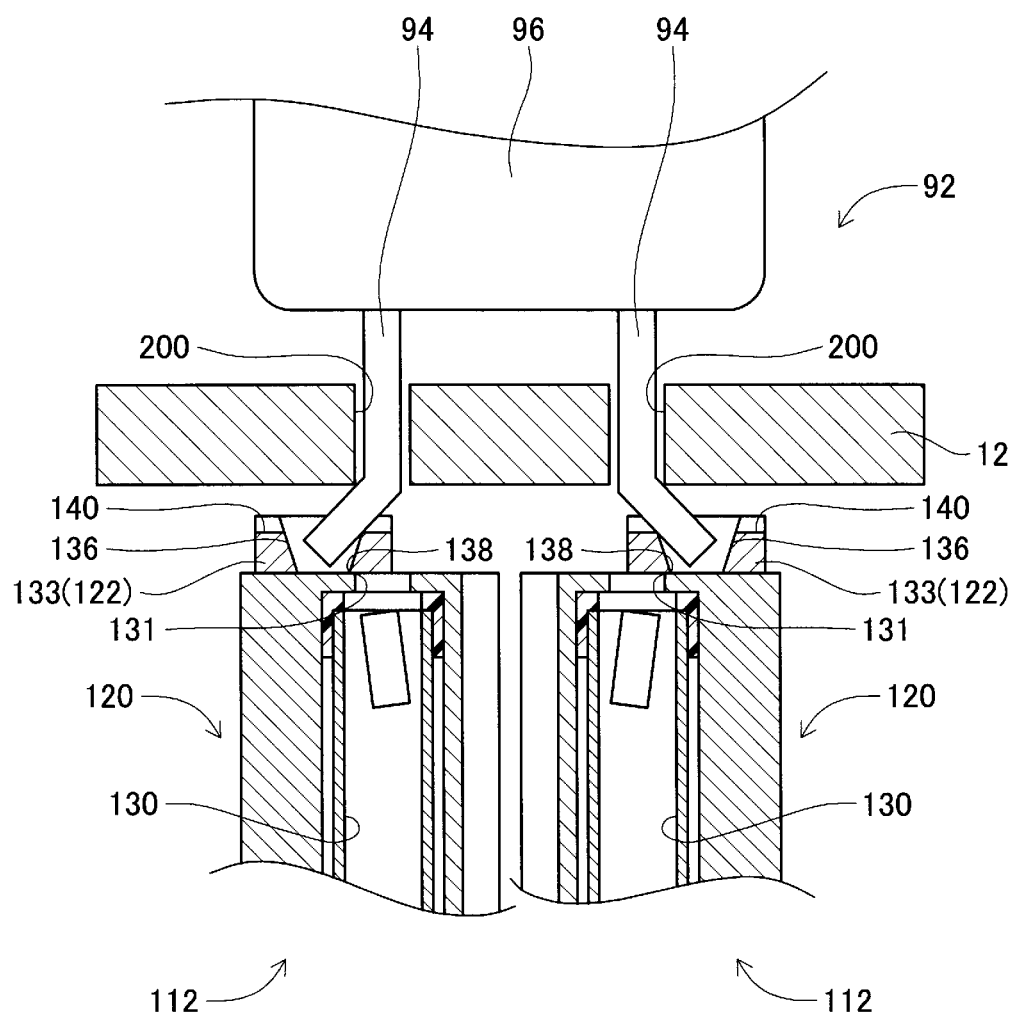
FIG. 17 is a cross section view of a cut and clinch unit after leads of a leaded component have been cut.

Next, by inserting leads 94 into through-holes 200 and then further lowering leaded component 92, as shown in FIG. 15, leads 94 are inserted into second insertion holes 136 and first insertion holes 130 of cut and clinch unit 100. Next, when leads 94 have been inserted into second insertion holes 136 and first insertion holes 130, in cut and clinch unit 100, the pair of movable sections 122 are slid by operation of slide device 124. Thus, as shown in FIG. 17, leads 94 are cut by fixed blade 131 of first insertion hole 130 and movable blade 138 of second insertion hole 136. Then, the tip section separated by the cutting of lead 94 falls through first insertion hole 130 and is discarded in discard box 132.

Also, the pair of movable sections 122, after cutting leads 94, are slid further. Thus, the new tip section formed by the cutting of lead 94 is bent along the tapered surface of the inside of second insertion hole 136 in accordance with the sliding of movable section 122, and the tip section of lead 94 is bent along guide groove 140 by the further sliding of movable section 122. Thus, leaded component 92 is mounted into circuit board 12 in a state in which leads 94 are bent so as to be prevented from coming out of through-holes 200.

Component mounter 10 is an example of a board work machine. Control device 36 is an example of a control device. Work head moving device 64 is an example of a moving device. Component holding tool 78 is an example of a holding tool. Leaded component 92 is an example of a leaded component. Lead 94 is an example of a lead. Through-hole 200 is an example of a through-hole.

Further, the present disclosure is not limited to the above example embodiments, and various changed or improved methods of embodiment are possible based on the knowledge of someone skilled in the art. Specifically, for example, in an embodiment above, the present disclosure is applied to mounting of a radial component, which is leaded component 92 with multiple leads protruding in the same direction from component main body 96, but the disclosure may be applied to mounting of an axial component, which is a leaded component with multiple leads arranged coaxially. Note that, when mounting a radial component as in an embodiment above, leads are oscillated in two directions (direction in which arrows 212 and 214 extend, and direction in which arrows 216 and 218 extend), but when mounting an axial component, leads are not oscillated in an axial direction of the base section of the leads. That is, leads are oscillated in two directions when performing radial component mounting, but leads may be oscillated in only one direction when performing axial component mounting.

Also, in an embodiment above, leads are moved along a straight line, but leads may be moved in paths of various shapes, such as a curved or circular path.

Also, when performing mounting work of leaded component 92 using image data of leaded component 92, for example, the form of movement of the leads may be changed using the image data of leaded component 92. For example, based on the image data, the width of oscillation of the leads, the oscillation quantity, the movement direction of the leads, and the like may be changed. Further, it may be set whether to perform insertion operation of leads into through-holes 200 while moving leads based on the image data. In detail, for example, based on the image data, bending of the leads may be checked, and if a lead is bent, insertion operation of leads into through-hole 200 may be performed while moving leads, but if leads are not bent, insertion operation of leads into through-hole 200 may be performed via a conventional method.

Also, in an embodiment above, the movement amount of leads is set in accordance with the diameter of the leads, but the movement amount of the leads may be set in accordance with not only the lead diameter, but also the internal diameter of through-holes 200, the length of the leads, and the like.

Also, in an embodiment above, oscillation operation of leads is stopped after oscillation of leads is performed for a specified quantity of times, but oscillation operation of leads may be stopped after oscillation of leads is performed for a specified time. Also, in an embodiment above, it is determined whether leads have been inserted into through-holes based on the air pressure of air cylinder 90 that is the drive source of pusher 88, but insertion of leads into through-holes may be detected by various methods. Specifically, for example, a sensor may be provided in first insertion hole 130 of cut and clinch unit or the like, and a lead detected by the sensor, such that insertion of the lead into a through-hole 200 can be detected. Also, for example, as a drive source for pressing leads against the upper surface of circuit board 12, a servo motor may be used instead of air cylinder 90, and insertion of a lead into a through-hole 200 may be detected by checking whether a torque value of the motor is equal to or below a threshold.

Also, in an embodiment above, leaded component 92 is lowered by pusher 88 the drive source of which is air cylinder 90, but instead of air cylinder 90, a servo motor may be used as a drive source for pressing leads into the upper surface of circuit board 12. In this case, a torque value of the motor or the like may be detected using an encoder, and pressing of the leads may be performed based on the detected value. Note that, when a servo motor is used as a drive source, the servo motor may be the item that moves work head 60, 62, or component holding tool 78, that is, may be the drive source of Z-direction moving device 72.

Also, in an embodiment above, oscillation operation of leads is performed after leads are lowered, but leads may be lowered while performing oscillation operation of leads.

REFERENCE SIGNS LIST

10: component mounter (board work machine); 36: control device; 64: work head moving device (moving device); 78: component holding tool (holding tool); 92: leaded component; 94: lead; 200: through-hole

The invention claimed is:

1. A board work machine comprising:
a holding tool configured to hold a leaded component;
a moving device configured to move the holding tool along an upper surface of a board; and
a control device configured to control operation of the moving device, wherein
the control device, by controlling operation of the moving device, moves a lead of the leaded component being held by the holding tool in a state contacting the upper surface of the board while pushing the lead against the board with a pushing force within a range in which the lead is elastically deformed so as to insert the lead into a through-hole formed in the board.

2. The board work machine according to claim 1, wherein the control device, by controlling operation of the moving device, after moving the lead of the leaded component being held by the holding tool in a first direction in a state contacting the upper surface of the board, moves the lead of the leaded component in a different direction to the first direction.

3. An insertion method for inserting a lead of a leaded component into a through-hole of a board, the insertion method comprising:
holding the leaded component with a holding tool of a board work machine;
moving the holding tool with a holding device along an upper surface of the board; and
moving the lead of the leaded component held by the holding tool in a state contacting the upper surface of the board while pushing the lead against the board with a pushing force within a range in which the lead is elastically deformed so as to insert the lead into the through-hole of the board.

* * * * *